(12) United States Patent
Nakano

(10) Patent No.: US 11,302,817 B2
(45) Date of Patent: Apr. 12, 2022

(54) SEMICONDUCTOR DEVICE AND PROCESS OF FORMING THE SAME

(71) Applicant: SUMITOMO ELECTRIC DEVICE INNOVATIONS, INC., Kanagawa (JP)

(72) Inventor: Takuma Nakano, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 17/060,960

(22) Filed: Oct. 1, 2020

(65) Prior Publication Data

US 2021/0083092 A1 Mar. 18, 2021

Related U.S. Application Data

(62) Division of application No. 16/144,727, filed on Sep. 27, 2018, now Pat. No. 10,833,195.

(30) Foreign Application Priority Data

Sep. 28, 2017 (JP) .............................. JP2017-188461

(51) Int. Cl.
| | |
|---|---|
| *H01L 31/072* | (2012.01) |
| *H01L 29/78* | (2006.01) |
| *H01L 29/40* | (2006.01) |
| *H01L 29/778* | (2006.01) |
| *H01L 29/66* | (2006.01) |
| *H01L 29/20* | (2006.01) |
| *H01L 29/417* | (2006.01) |

(52) U.S. Cl.
CPC .......... *H01L 29/785* (2013.01); *H01L 29/402* (2013.01); *H01L 29/66462* (2013.01); *H01L 29/778* (2013.01); *H01L 29/7786* (2013.01); *H01L 29/2003* (2013.01); *H01L 29/41766* (2013.01)

(58) Field of Classification Search
CPC ........................... H01L 29/402; H01L 29/785
See application file for complete search history.

(56) References Cited

U.S. PATENT DOCUMENTS

| 5,866,475 A | 2/1999 | Yanagida |
|---|---|---|
| 2012/0018735 A1 | 1/2012 | Ishii |
| 2014/0203877 A1 | 7/2014 | Ota |
| 2015/0279722 A1 | 10/2015 | Kikuchi |
| 2017/0162659 A1 | 6/2017 | Yoshida |

FOREIGN PATENT DOCUMENTS

| JP | 2005-277027 | 10/2005 |
|---|---|---|
| JP | 2010-263022 | 11/2010 |
| JP | 2012-028423 | 2/2012 |
| JP | 2017-107942 | 6/2017 |
| WO | 2013-027722 | 2/2013 |

*Primary Examiner* — Samuel A Gebremariam
(74) *Attorney, Agent, or Firm* — Smith, Gambrell & Russell, LLP.

(57) ABSTRACT

A semiconductor device type of field effect transistor (FET) primarily made of nitride semiconductor materials is disclosed. The FET includes a nitride semiconductor stack providing primary and auxiliary active regions and an inactive region surrounding the active regions; electrodes of a source, a drain, and a gate; an insulating film covering the electrodes and the semiconductor stack; and a field plate on the insulating film. A feature of the FET of the invention is that the field plate is electrically in contact with the auxiliary active region through the opening provided in the insulating film.

14 Claims, 9 Drawing Sheets

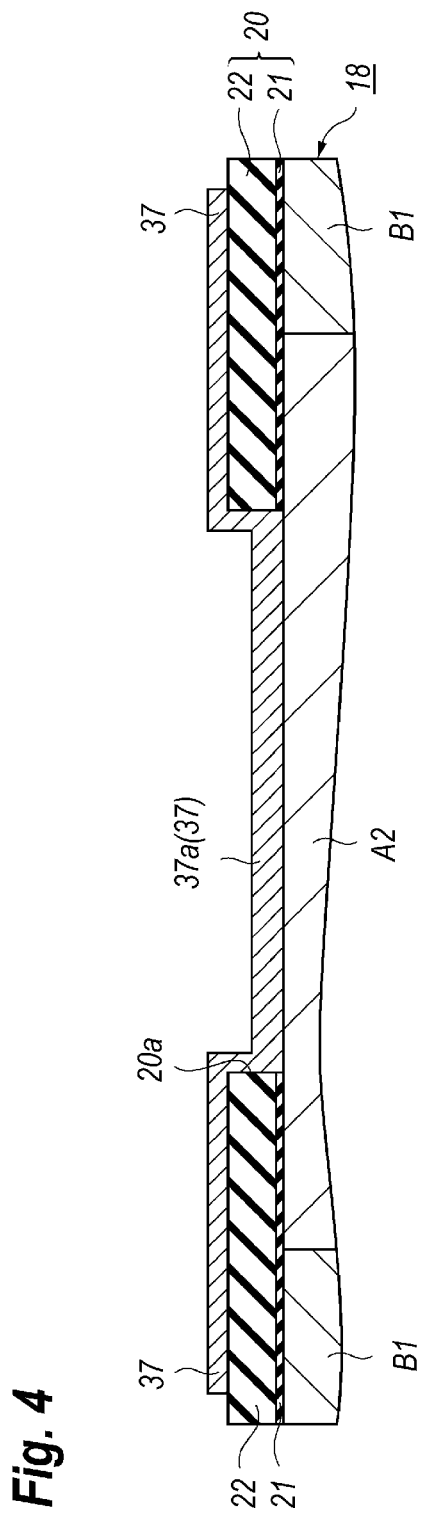

SEMICONDUCTOR DEVICE AND PROCESS OF FORMING THE SAME

CROSS REFERENCE TO RELATED APPLICATIONS

The present application is a division of U.S. application Ser. No. 16/144,727 filed on Sep. 27, 2018 and claims priority therefrom under 35 U.S.C. 120. Application Ser. No. 16/144,727 is based on and claims the benefit of priority of Japanese Patent Application No. 2017-188461, filed on Sep. 28, 2017, the entire content of which is incorporated herein by reference.

BACKGROUND OF INVENTION

1. Field of Invention

The present invention relates to a semiconductor device type of field effect transistor (FET) and a process of forming the semiconductor device.

2. Background Arts

A Japanese Patent application laid open No. JP-2017-107942A has disclosed a semiconductor device, exactly, a field effect transistor (FET) accompanying a field plate electrically connected with the source electrode.

An FET primarily made of nitride semiconductor materials often provides a field plate partially overlapping with a gate electrode interposing an insulating film therebetween to moderate field strength induced in an edge of the gate electrode. The field plate may also suppress reduction in a drain current due to, what is called, current collapse inherently attributed to a nitride semiconductor device. A field plate may further show a function to suppress coupling between a drain electrode and a gate electrode.

A field plate is often forms by a metal evaporation and a subsequent lift-off process. Specifically, a field plate is usually formed by steps of (a) first forming a mask with an opening corresponding to a field plate on an insulating film that covers a gate electrode, (b) evaporating metals for the field plate, and (c) removing residual metals deposited on the mask by the lift-off process. Accordingly, the field plate independently exists on the insulating film just after the formation thereof, and is electrically isolated from any conductive materials. Accordingly, charges induced during processes subsequently carried out may be easily accumulated within the field plate. Excessively accumulated charges in the field plate sometimes cause electrostatic discharge, which may make a short circuit between the field plate and the gate electrode. For instance, when the lift-off process to remove the residual metals left on the mask uses a jet spray of solvents against the mask, the solvents sprayed onto the field plate may cause a friction and accumulate charges in the field plate. Excessively accumulated charges sometimes cause arc discharge against the gate electrode to make a short circuit thereto. When the field plate is electrically connected to the source electrode, the short circuit between the gate electrode and the field plate means a short circuit between the gate electrode and the source electrode, which makes the FET inoperable no longer.

SUMMARY OF INVENTION

An aspect of the present invention relates to a semiconductor device type of field effect transistor (FET) primarily made of nitride semiconductor materials. The semiconductor device comprises a nitride semiconductor stack; electrodes of a drain, a source, and a gate each provided on the nitride semiconductor stack in the primary active region; an insulating film that covers the electrodes and the nitride semiconductor stack exposed between the electrodes; and a field plate provided on the insulating film. The nitride semiconductor stack has a primary active region, an auxiliary active region, and an inactive region that surrounds the primary active region and the auxiliary active region. The insulating film provides an opening in the auxiliary region. A feature of the semiconductor device of the invention is that the field plate is electrically in contact with the auxiliary active region through the opening provided in the insulating film.

Another aspect of the present invention relates to a process of forming a field effect transistor that is primarily made of nitride semiconductor materials. The process comprises steps of: (a) forming a semiconductor stack; (b) forming a primary active region, an auxiliary active region, and an inactive region in the semiconductor stack; (c) forming electrodes of a drain, a source, and a gate on the semiconductor stack in the primary active region; (d) depositing an insulating film on the electrodes of the drain, the source, and the gate, and the semiconductor stack exposed between the electrodes; (e) forming an opening in the insulating film in the auxiliary active region; forming a field plate on the insulating film. A feature of the process of the present invention is that the field plate is formed so as to overlap with the gate electrode and makes in contact with the auxiliary active region through the opening in the insulating film.

BRIEF DESCRIPTION OF THE DRAWINGS

The foregoing and other purposes, aspects and advantages will be better understood from the following detailed description of a preferred embodiment of the invention with reference to the drawings, in which:

FIG. 4 is a cross sectional view of the auxiliary active region taken along the line IV-IV indicated in FIG. 3;

DESCRIPTION OF EMBODIMENT

Next, embodiment according to the present invention will be described as referring to accompanying drawings. The present invention, however, is not restricted to the embodiment, and has a scope defined in claims and all changes and modifications equivalent to the claims. In the description of the drawings, numerals or symbols same with or similar to each other will refer to elements same with or similar to each other without duplicating explanations.

Figure 1:
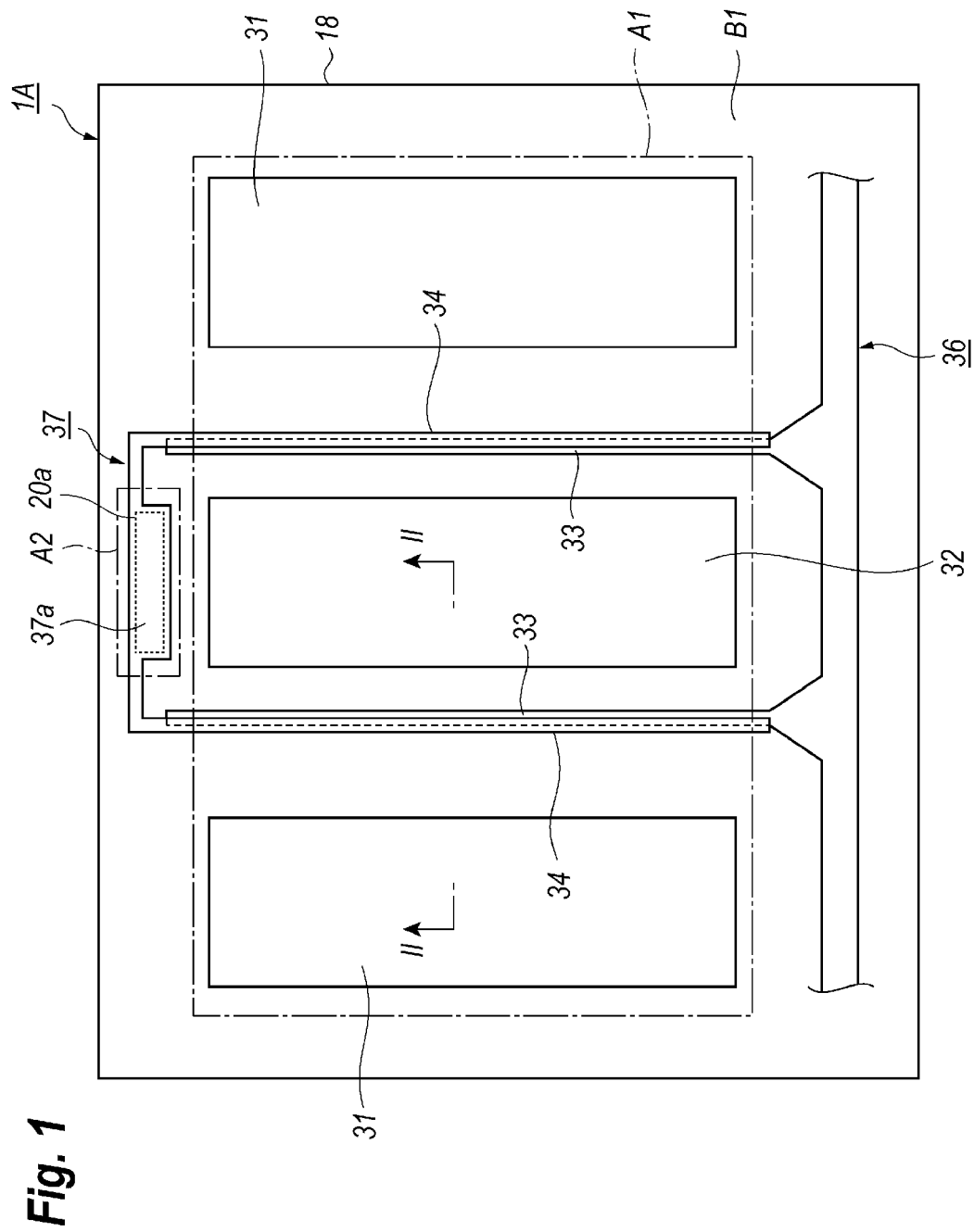
FIG. 1 is a plan view showing a transistor according to embodiment of the present invention.
Figure 2:
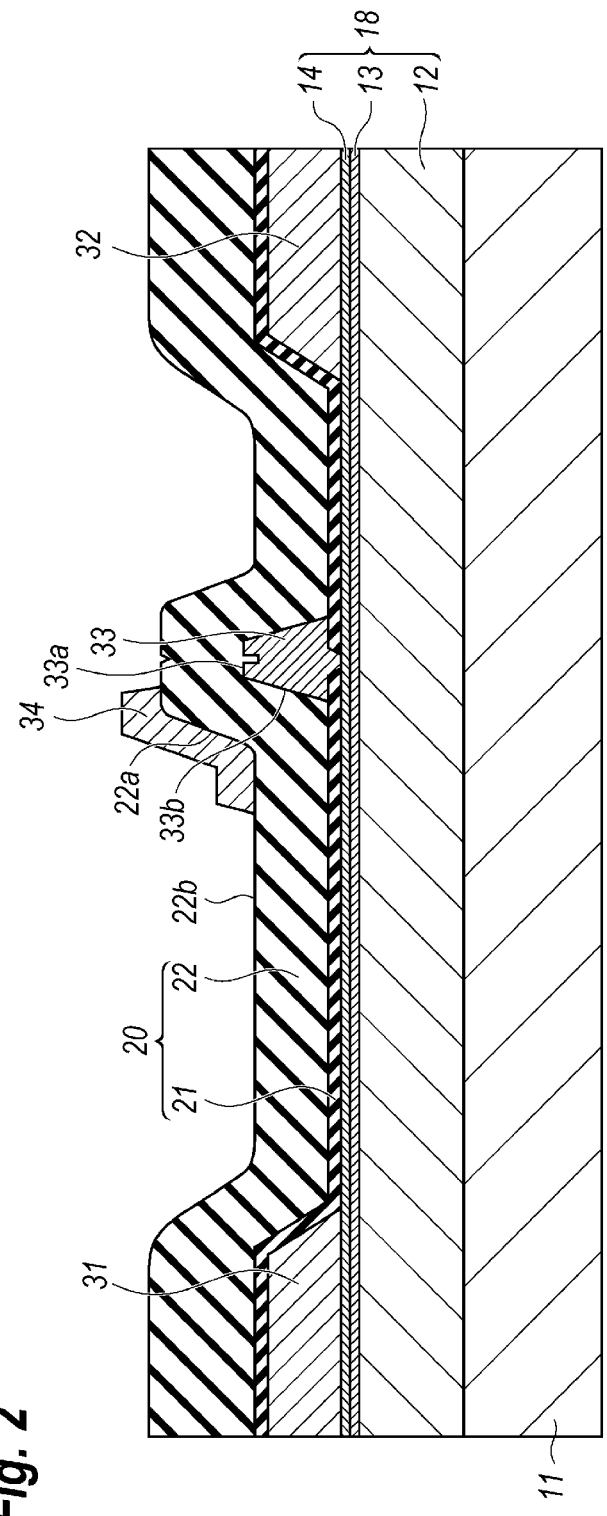
FIG. 2 is a cross sectional view of the transistor taken along the line II-II indicated in FIG. 1.

FIG. 1 is a plan view showing a transistor 1A according to embodiment of the present invention; and FIG. 2 is a cross sectional view of the transistor 1A taken along the line II-II indicated in FIG. 1.

The transistor 1A of the present embodiment provides a substrate 11, a semiconductor stack 18 on the substrate 11 where the semiconductor stack 18 includes nitride semiconductor layers, and electrodes of a drain 31, a source 32, and a gate 33 each provided on the semiconductor stack 18. The transistor 1A of the present embodiment has a type of, what is called, high electron mobility transistor (HEMT). That is, the semiconductor stack 18 includes a channel layer 12, a barrier layer 13, and a cap layer 14, where the channel layer 12 and the barrier layer 13 induce a two-dimensional electron gas (2 DEG) in the channel layer 12 at an interface therebetween. The 2 DEG becomes a channel for transporting carriers, namely, electrons therein. The HEMT 1A may further provide an insulating film 20 and a field plate 34 on the insulating film 20, where the insulating film 20 covers the electrodes, 31 to 33, and the semiconductor stack 18, while, the field plate 34 is provided on the insulating film 20 so as to partially overlap with the gate electrode 33. The insulating film 20 of the present embodiment includes a first insulating film 21 on the semiconductor stack 18 and a second insulating film 22 on the first insulating film 21.

The substrate 11, which is for epitaxially growing nitride semiconductor layers thereon, may be made of silicon (Si), silicon carbide (SiC), sapphire ($Al_2O_3$), diamond (C), and so on, where the present embodiment provides the substrate 11 made of SiC. The substrate 11 may have a thickness of, for instance, 500 µm. The channel layer 12, which is epitaxially grown on the substrate 11, may be made of gallium nitride (GaN), and as described above, has a channel at the interface against the barrier layer 13. The channel layer 12 may have a thickness of, for instance 500 nm.

The barrier layer 13, which is epitaxially grown on the channel layer 12, may be made of nitride semiconductor material having electron affinity greater than that of the channel layer 12. The barrier layer 13 may be made of aluminum gallium nitride (AlGaN), indium aluminum nitride (InAlN), and/or indium aluminum gallium nitride (InAlGaN). The barrier layer may have a thickness of, for instance, 20 nm. Although the present embodiment provides the barrier layer 13 as an undoped layer, but the barrier layer 13 may be doped with n-type dopants and shows n-type conduction. The cap layer 14, which is epitaxially grown on the barrier layer 13, may be made of GaN with a thickness of, for instance, 5 nm. The cap layer 14 may also show the n-type conduction.

Referring to FIG. 1 again, the semiconductor stack 18 includes a primary active region A1 and an inactive region B1 outside of the primary active region A1. The primary active region A1 may operate as a transistor, while, the inactive region B1, which may be formed by implanting ions, typically, argon ions ($Ar^+$) into the primary active region A1, may electrically isolate the transistor 1A from those formed neighbor thereto. In the present embodiment, the primary active region A1 accompanies with an auxiliary active region A2 in the inactive region B1. The inactive region B1 may electrically isolate the primary active region A1 from auxiliary active region A2 provided side by side to the present active region A1.

The drain electrode 31 and the source electrode 32 are formed in the primary active region A1, where the present embodiment provides two drain electrodes 31 and one source electrode 32 in the primary active region A1. Two drain electrodes 31 and the source electrode 32 are arranged in this order on the semiconductor stack 18, that is, two drain electrodes 31 sandwich the source electrode 32 therebetween. The drain electrode 31 and the source electrode 32, which are type of ohmic electrode, may be formed by allowing stacked metals of tantalum (Ta) and aluminum (Al). Stacked metals including another tantalum (Ta) on Al may be applicable as a source material for the ohmic electrodes, 31 and 32. Two drain electrodes 31 are electrically connected with each other through a drain interconnection, which is not illustrate in FIG. 1.

Referring to FIG. 2, the drain electrode 31 and the source electrode 32 of the present embodiment are in contact with the cap layer 14; however, those electrodes, 31 and 32, may be formed on the barrier layer 13, or may be in contact with the interface, or around the interface between the channel layer 12 and the barrier layer 13 by forming recesses in the cap layer 14 and the barrier layer 13. The drain electrode 31 and the source electrode 32 are covered with the first and second insulating films, 21 and 22, in the embodiment shown in FIG. 2. In an alternative, the drain electrode 31 and the source electrode 32 are covered with only the second insulating film 22. That is, the ohmic electrodes, 31 and 32, may be in contact with the semiconductor stack 18 through respective openings formed in the first insulating film 21. The ohmic electrodes, 31 and 32 may have a thickness around 300 nm.

Referring to FIG. 1 again, the gate electrode 33 is provided in the primary active region A1, where two gate electrodes 33 are arranged on the primary active region A1 in the present embodiment, one of which is disposed between one of the drain electrode 31 and the source electrode 32, while, another gate electrode 33 is arranged between another of the drain electrode 31 and the source electrode 32. The gate electrode 33, which has stacked metals of nickel (Ni) and gold (Au) with a total thickness of, for instance, 350 nm, where Ni is in contact with the semiconductor stack 18 through the opening in the first insulating film 21 to make a Schottky contact thereto. A portion of the gate electrode 33 extends on the first insulating film 21 in peripheries of the opening in the first insulating film 21. The gate electrode 33 is fully covered with the second insulating film 22. Two gate electrodes 33 in the primary active region A1 are connected to each other by a gate interconnection 36 provided in the inactive region B1.

The first insulating film 21 covers the semiconductor stack 18 exposed between the electrodes, 31 to 33. The first insulating film 21, as described above, provides the opening that exposes the semiconductor stack 18 into which the gate electrode 33 is filled. The first insulting film 21 may be made of inorganic material containing silicon (Si), typically, silicon nitride (SiN), silicon oxide ($SiO_2$), and the like, and have a thickness of, for instance, 60 nm. The first insulating film 21 made of SiN may be formed by the low pressure chemical vapor deposition (LPCVD) technique, which is popular in the field of a semiconductor manufacturing process.

The second insulating film 22, which is in contact with the first insulating film 21, may cover the first insulating film 21 and the electrodes, 31 to 33. In particular, the second insulating film 22 covers a top 33a and sides 33b of the gate electrode 33 in the portion extending on the first insulating film 21. Accordingly, the second insulating film 22 forms steps 22a reflecting a cross section of the gate electrode 33 and a planar portion 22b extending from the step 22a to the drain electrode 31. The second insulating film 22 may be also made of inorganic material containing Si, typically, made of SiN with a thickness of 100 to 500 nm, where the present embodiment provides the second insulating film 22 with a thickness of 400 nm. When the first insulating film 21 is formed by the LPCVD technique, the second insulating film 22 may be preferably formed by plasma-assisted chemical vapor deposition (p-CVD) technique to distinguish the second insulating chemically film 22 from the first insulating film 21.

The field plate 34 has stacked metals of Ni and Au, or Ti and Au, where Ni or Ti is in contact with the second insulating film 22. The present embodiment provides two field plates 34 corresponding to the two gate electrodes 33. One of the field plates 34 is provided between one of the gate electrode 33 and one of the drain electrode 31 partly overlapping with the gate electrode 33 in a side closer to the drain electrode 31; while another field plate 34 is provided between another of the gate electrode 33 and the other of the drain electrode 31 partly overlapping with the other of the gate electrode 33.

Referring to FIG. 2, the field plates 34 extends from the step 22a to the planar portion 22b between the drain electrode 31 and the gate electrode 33. The field plate 34, which may be electrically connected with the source electrode 32, may reduce coupling of the gate electrode 33 with the drain electrode 31 and moderates the field strength at an edge of the gate electrode 33. The field plate 34 may have a total thickness of 100 to 600 nm, where the embodiment shown in FIG. 2 has a thickness of 300 nm.

Two field plates 34 of the present embodiment are connected with the source electrode 32 through source interconnections, which means that the field plate 34 has a same potential as that of the source electrode 32. In an alternative, the field plate 34 may be electrically floated, that is, the field plate 34 may electrically connected with nowhere.

Figure 3:
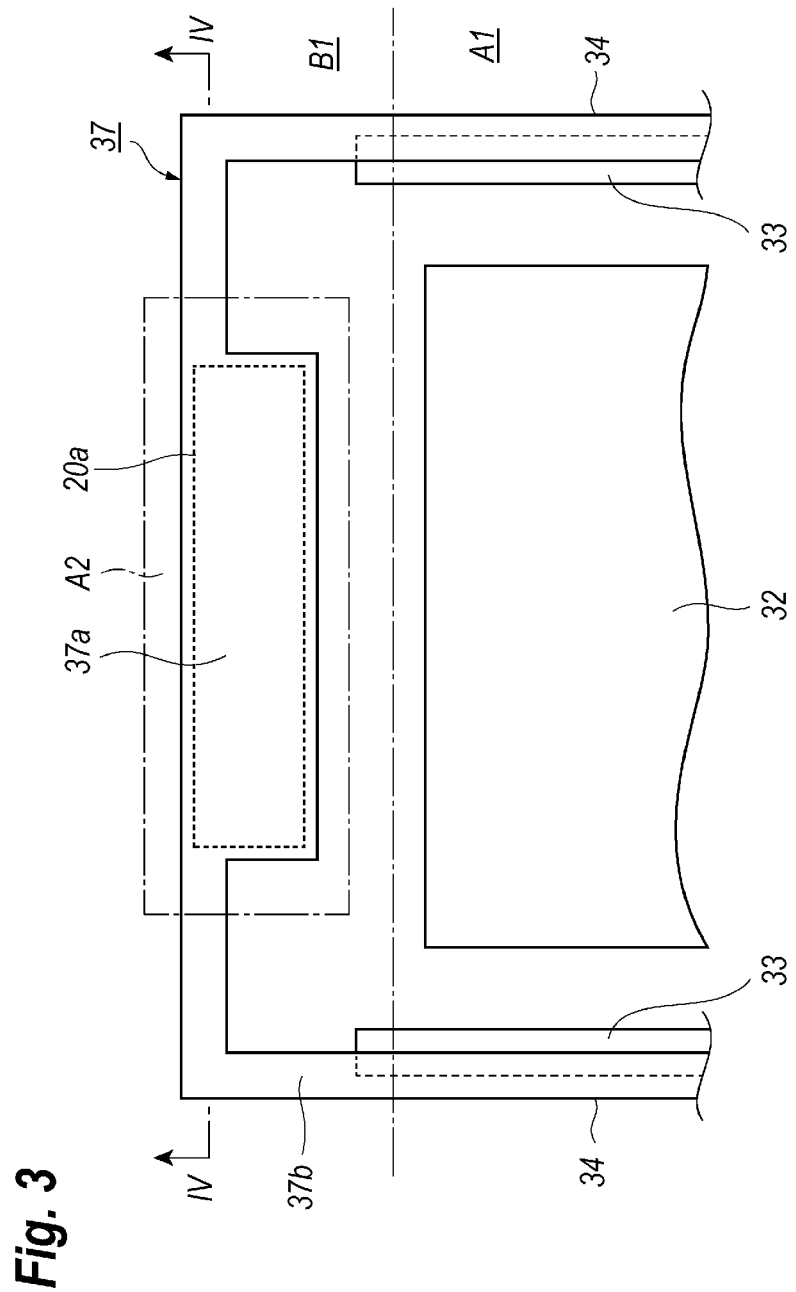
FIG. 3 magnifies an auxiliary active region provided outside of the primary active region.

FIG. 3 magnifies the auxiliary active region A2 outside of the primary active region A1, and FIG. 4 is a cross sectional view of the auxiliary active region A2 taken along the line IV-IV indicated in FIG. 3. The auxiliary active region A2 is arranged in side by side with respect to the source electrode 32 interposing the inactive region B1 therebetween; that is, two active regions, A1 and A2, are arranged in side by side interposing the inactive region B1 therebetween. In an alternative, two active regions, A1 and A2, may be continuous without interposing the inactive region B1 therebetween.

The auxiliary active region A2, which as a rectangular plane shape, with a length of, for instance, 30 μm along the primary active region A1 and a width of, for instance, 11 μm along a direction connecting the two active regions, A1 and A2. The auxiliary active region A2 has an area, which is smaller than that of the primary active region A1, may be adjusted taking a total area of the field plate 34 into account, where the total area includes areas of the two field plates 34 and an area of interconnection 37 including a narrowed portion 37b connecting the field plates 34 with the auxiliary active region A2 and a widened portion 37a overlapping with the auxiliary active region A2, which may be called as a pad. The auxiliary active region A2 preferably has an area ratio of 0.5 to 2.0 against the total area of the field plate 34. The auxiliary active region A2 preferably shows resistivity smaller than $10^{-2}$ Ωcm.

Also, as shown in FIG. 4, the insulating film 20, exactly, the first and second insulating films, 21 and 22, provides an opening 20a through which the top of the semiconductor stack 18 exposes. The opening 20a overlaps with the pad 37a in the interconnection 37, that is, the opening 20a fully overlaps with the auxiliary active region A2. The opening 20a in the insulating film 20 may expose the cap layer 14, the barrier layer 13, and/or the channel layer 12. The opening 20a may be a rectangular plane shape and provided within the auxiliary active region A2.

Two field plates 34 are connected with each other through the interconnection 37 that may be made of metal substantially same with the field plate 34. The interconnection 37, which extends from the inactive region B1 to the auxiliary active region A2, is provided on the insulating film 20 in the inactive region B1, while, fallen within the opening 20a in the auxiliary active region A2 and in contact with the semiconductor stack 18 thereat; that is, the interconnection 37 may be in contact with the cap layer 14, the barrier layer 13, and the channel layer 12. Further specifically, Ni or Ti, or Au in the interconnection 37 may be in contact with the semiconductor stack 18. The interconnection 37 may have a thickness substantially same with that of the field plate 34.

The interconnection 37 may be in contact with the semiconductor stack 18 at the pad 37a, that is, the opening 20a in the insulating film 20 substantially overlaps with the pad 37a in the interconnection 37. The pad 37a has a longitudinal length of, for instance, 5 μm along the primary active region A1. An area where the interconnection 37 is in contact with the semiconductor stack 18, that is, an area of the opening 20a in the insulating film 20 may be adjusted taking the total area of the field plate into account; that is, the area of the field plate 34 in addition to that of the interconnection 37. Specifically, an area ratio of the opening 20a against the total area of the field plate 34 and the interconnection 37 is preferably set to be greater than 0.6.

Next, a process of forming the transistor 1A according to the present embodiment will be described referring to FIG. 5A to FIG. 7B, where those figures are cross sectional views of the transistor 1A at respective steps of a process of forming the transistor 1A. The process of forming the auxiliary active region A2 will be described later.

Figure 5A:
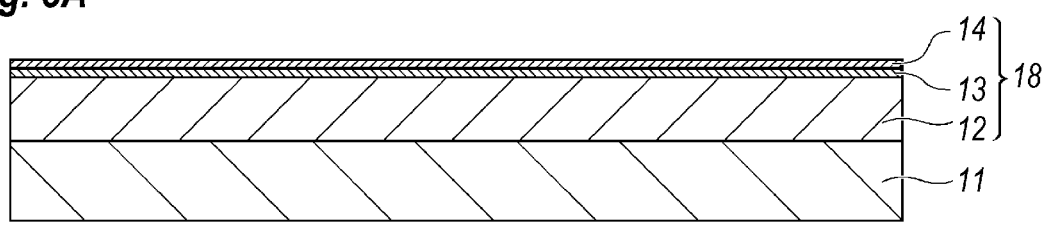
FIG. 5A to FIG. 5C are cross sectional views of the transistor shown in FIG. 2 at respective steps of the process of forming the transistor.

First, as shown in FIG. 5A, the process forms the semiconductor stack 18 by sequentially growing the channel layer 12, the barrier layer 13, and the cap layer 14 on the substrate 11. The epitaxial growth may be carried out by, what is called, the metal organic chemical vapor deposition (MOCVD) technique, which is popular in the field of the semiconductor process, in particular, the process of forming a compound semiconductor device. Thereafter, the inactive region B1 may for formed by forming a mask that covers regions to be formed as the primary active region A1 and the auxiliary active region A2, respectively, and subsequent step of implanting ions, for instance, argon ions (Ar$^+$) into the semiconductor stack 18 in regions exposed from the mask. Thus, the inactive region B1 may be formed.

Figure 5B:
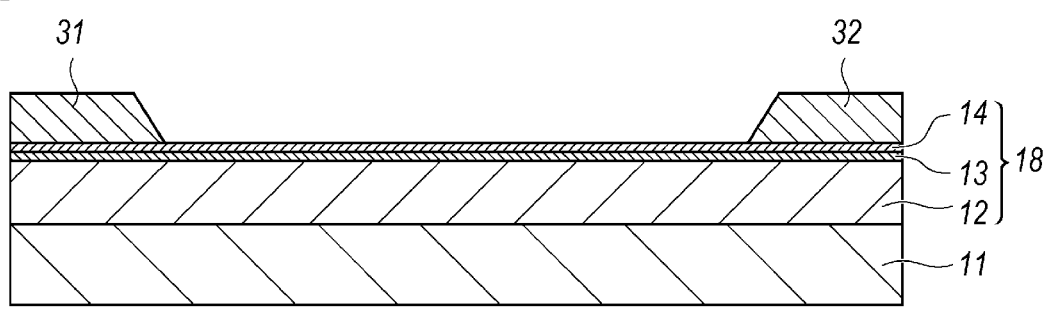
Figure 5C:
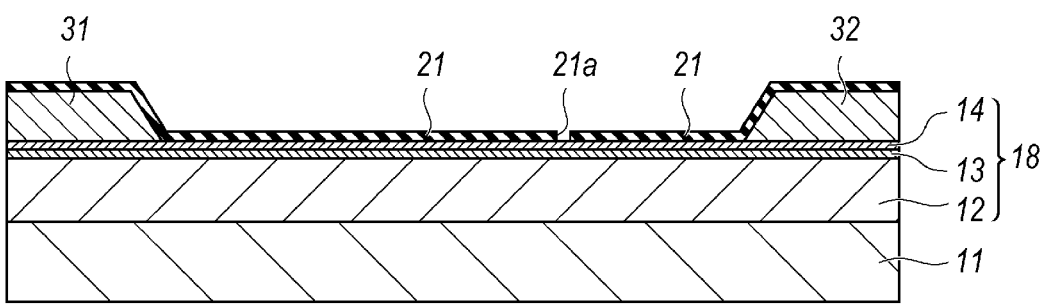

Thereafter, as shown in FIG. 5B, the drain electrode 31 and the source electrode 32 are formed on the cap layer 14. Specifically, forming another mask with openings in regions corresponding to the drain and source electrodes, 31 and 32; then, stacking metals of titanium (Ti) and aluminum (Al) within the openings, and finally, alloying the stacking metals at a temperature higher than 500° C., the ohmic electrodes of the drain 31 and the source 32 may be formed on the cap layer 14. Then, as shown in FIG. 5C, the drain electrode 31, the source electrode 32, and the semiconductor stack 18 exposed between the drain and source electrodes, 31 and 32, are covered with the first insulating film 21. The first insulating film 21 may be formed by a chemical vapor deposition (CVD) technique; specifically, the plasma-enhanced CVD (p-CVD) technique or the low pressure chemical vapor deposition (LPCVD) technique.

In an alternative, a sequence of; depositing the first insulating film 21 first; forming openings in the first insulating film 21 in positions corresponding to the drain and source electrodes, 31 and 32; depositing the metals, and finally alloying the deposit metals; may be applicable to form the drain and source electrodes, 31 and 32.

Figure 6A:
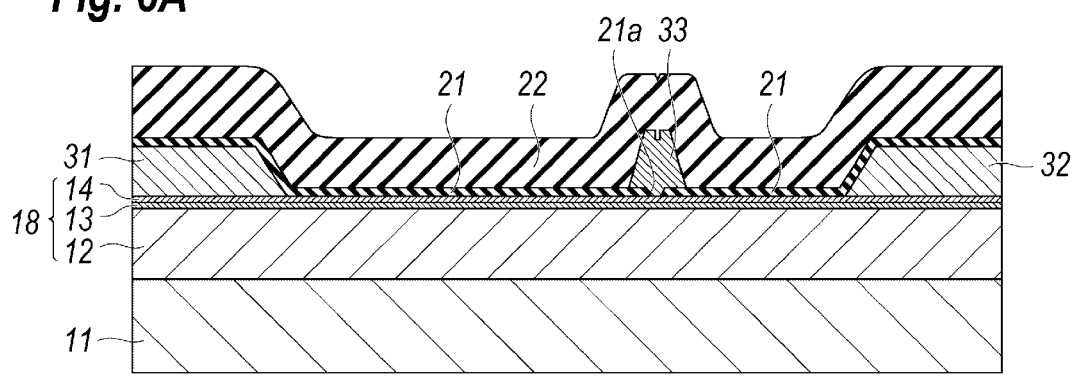
FIG. 6A and FIG. 6B are cross sectional views of the transistor shown in FIG. 2 at respective steps subsequent to the step shown in FIG. 5C.

Thereafter, sequential processes of the photolithography, the etching of the first insulating film 21, and the metal evaporation may form the gate electrode 33. Specifically, the photolithography forms a patterned photoresist with an opening corresponding to the gate electrode 33. Then, a reactive ion etching (RIE) may form an opening in the first insulating film 21, and the metal evaporation accompanying with the lift-off technique may form the gate electrode 33. Then, the second insulating film 22 is deposited on the electrodes of the drain 31, the source 32, the gate 33, and the first insulating film 21 using a CVD technique, as shown in FIG. 6A.

Figure 6B:
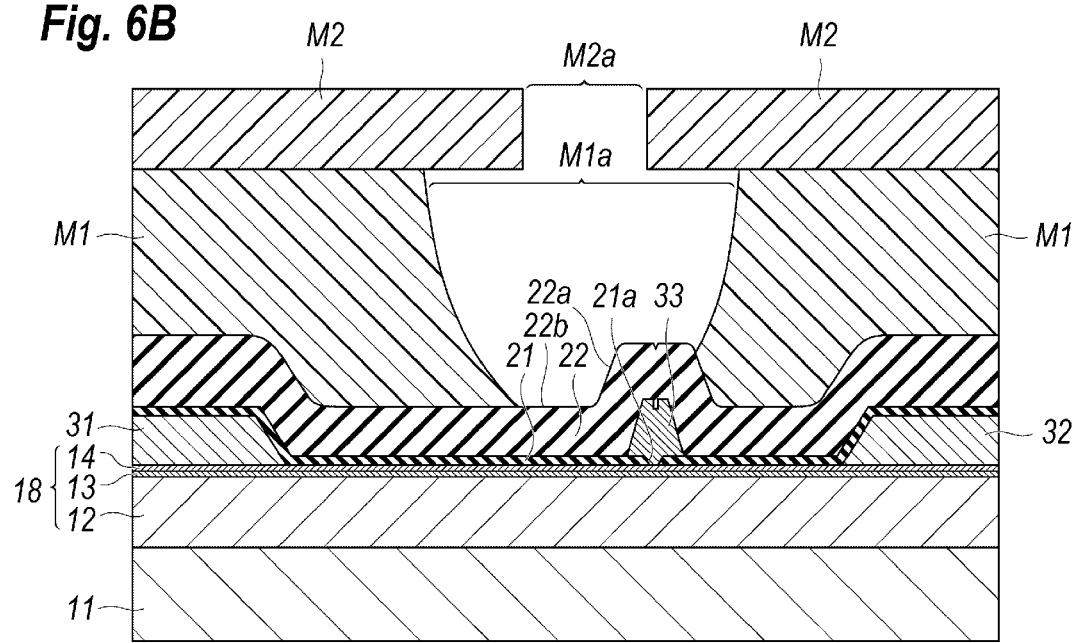

Thereafter, two patterned masks, M1 and M2, are prepared on the second insulating film 22, as shown in FIG. 6B, where the first mask M1 is formed thicker than the second mask M2. Specifically, the first mask M1 has a thickness at least greater than a total thickness of the gate electrode 33 and the field plate 34. When the masks, M1 and M2, are type of positive photoresist, namely, illuminated portions thereof becomes solvable for a developer, the second mask M2 is selected to have photosensitivity smaller than that of the first mask M1. As shown in FIG. 6B, the masks, M1 and M2, have respective openings, M1a and M2a, where the former opening M1a is wider than the latter opening M2a due to a difference in the photosensitivity of respective materials for the masks, M1 and M2. Thus, the second mask M2 may form overhangs against the first mask M1. The second opening M2a partially overlaps with the gate electrode 33, exactly, in a side of the drain electrode 31. Thus, the second opening M2a is formed above the second insulating film 22 in a position neighbor to the step 22a thereof and on the top of the gate electrode 33.

Figure 7A:
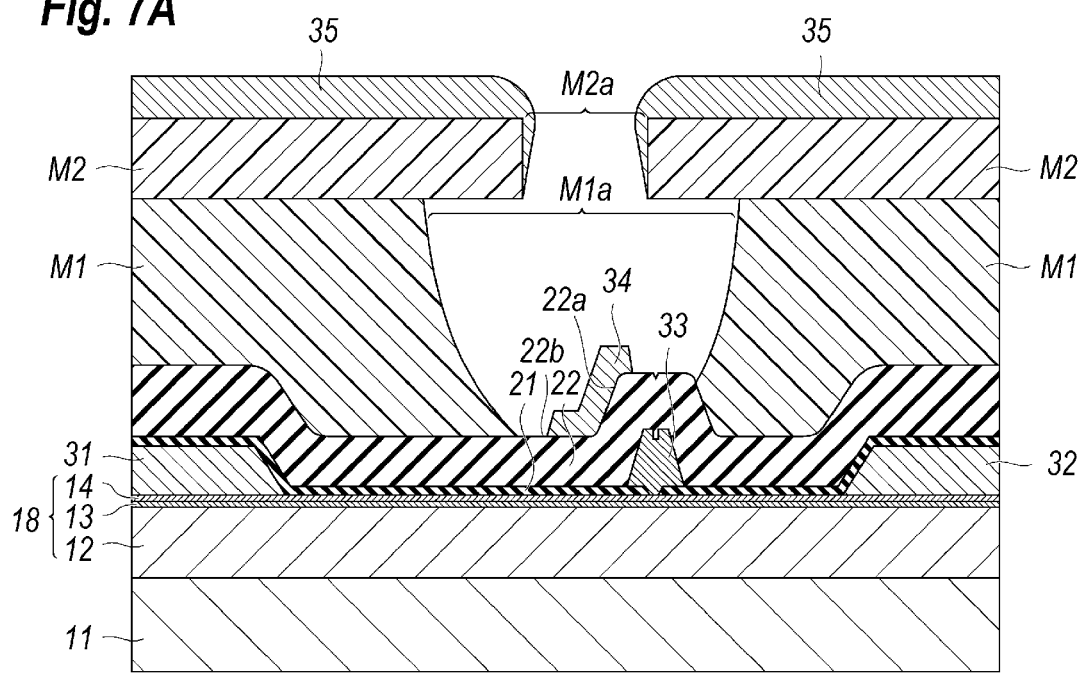
FIG. 7A and FIG. 7B are cross sectional views of the transistor shown in FIG. 2 at respective steps subsequent to the step shown in FIG. 6B.
Figure 7B:
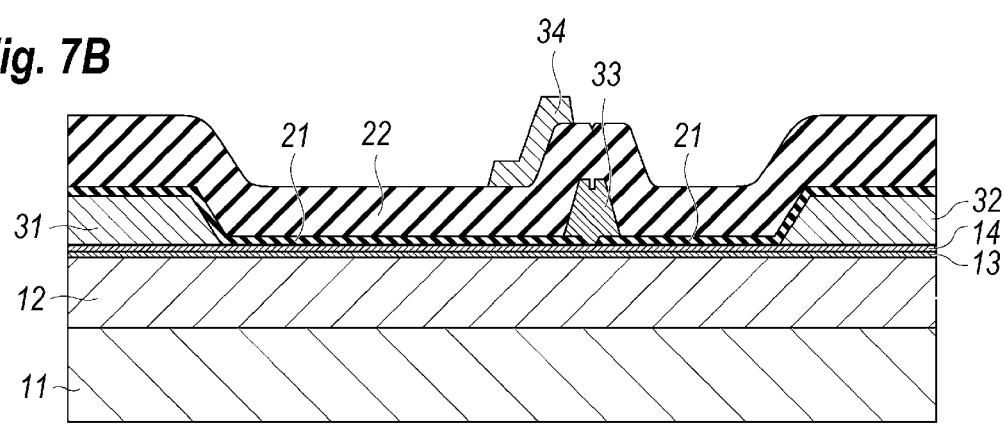

Thereafter, metals for the field plate 34 are deposited as shown in FIG. 7A by, for instance, a vacuum evaporation. The metals may be accumulated not only on the insulating film 22 and but on the second mask M2. Removing the masks, M1 and M2, accompanying with residual metals 35 thereon by the lift-off technique, the field plate 34 may be left on the second insulating film 22. The lift-off technique may accompany with a spray jet of solvents such as isopropyl alcohol (IPA) with a pressure of 5 to 50 MPa.

Figure 8A:
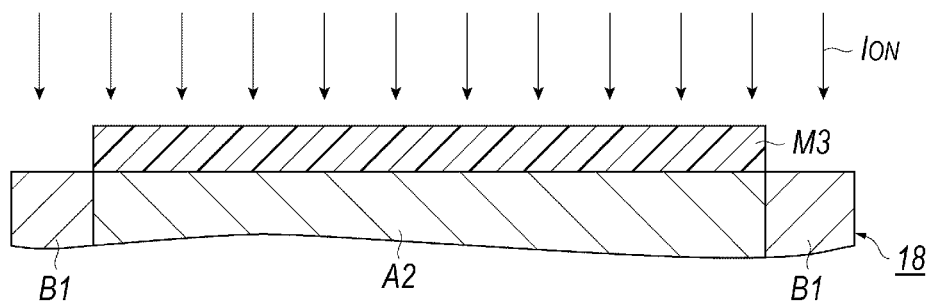
FIG. 8A to FIG. 8D are cross sectional views of the auxiliary active region at respective steps of forming the transistor shown in FIG. 2.

Next, a process of forming arrangements around the auxiliary active region A2 will be described in detail referring to FIG. 8A to FIG. 8D that are cross sectional views around the auxiliary active region A2 at respective steps. First, as shown in FIG. 8A, a mask M3 made of photoresist is patterned so as to cover a region to be converted into the auxiliary active region A2. Ion implantation carried out subsequent to the mask formation may implant ions, for instance, positive argon ions ($Ar^+$) into the region exposed from the mask M3, which forms the inactive region B1 around the primary active region A1 and the auxiliary active region A2. Thus, two active regions, A1 and A2, may be formed at one step.

Figure 8B:
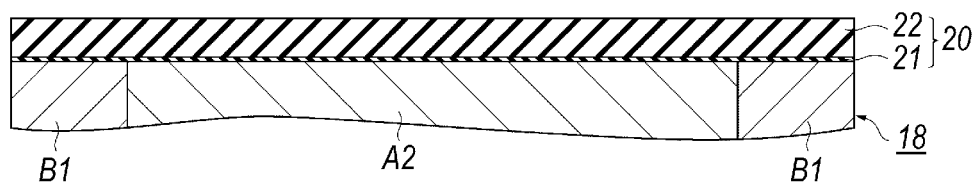

Thereafter, as shown in FIG. 8B, the insulating film 20 including the insulating films, 21 and 22, is formed on the semiconductor stack 18. The first insulating film 21 may be formed at the step shown in FIG. 5C, while, the second insulating film 22 may be formed at the step shown in FIG. 6A. That is, the gate electrode 33 is formed after the formation of the first insulating film 21 but before the formation of the second insulating film 22.

Figure 8C:
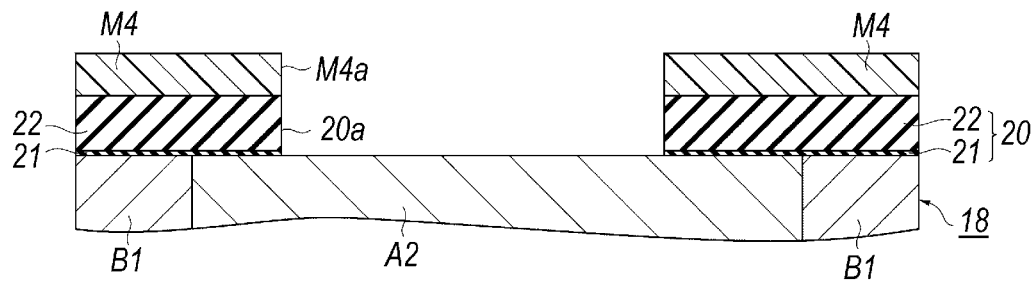
Figure 8D:
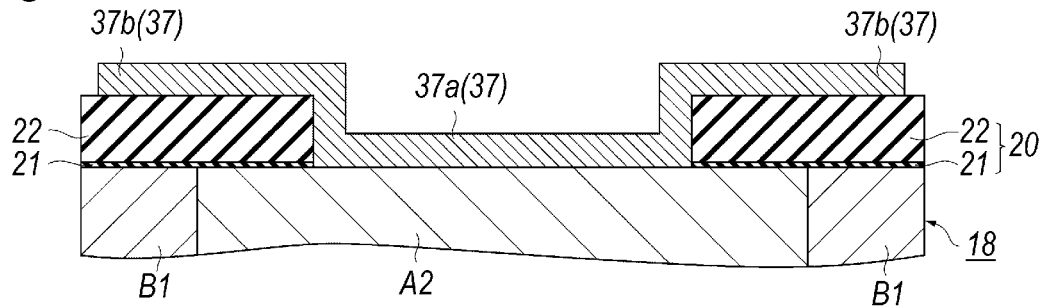

Thereafter, as shown in FIG. 8C, another patterned mask M4 is formed on the insulating film 20, where the mask M4 provides an opening M4a corresponding to the auxiliary active region A2, where the mask M4 provides the opening M4a outside of the source electrode 32, specifically, an outside of a lateral edge of the source electrode 32. That is, the opening M4a has a longitudinal edge extending along the lateral edge of the source electrode 32 with a gap therebetween. The insulating film 20 exposed within the opening M4a are removed to form an opening 20a therein by, for instance, the reactive ion etching (RIE). Also, the opening M4a locates inside of the auxiliary active region A2; that is, the auxiliary active region A2 fully covers the opening M4a in the mask M4. The formation of the opening 20a in the insulating film 20 is carried out after the deposition of the second insulating film 22 at the step shown in FIG. 6A but before the formation of the field plate at the step shown in FIG. 6B.

Thereafter, the narrowed portion 37b, which connects a pad 37a fully covering the opening 20a in the insulating film 20 with the field plate 34, may be formed simultaneously with the formation of the field plate 34. That is, the first and second masks, M1 and M2, have a pattern corresponding to the pad 37a and the interconnection 37b in addition to that for the field plate 34. Depositing the metals for the field plate 34 and removing residual metals 35 deposited on the mask M2 by the lift-off technique may form the pad 37a and the narrowed portion 37b simultaneously with the formation of the field plate 34. The field plate 34 may be in contact with the auxiliary active region A2 just after the deposition of the metals; accordingly, even when the lift-off technique uses the spray jet of the solvents, charges induced by friction of the solvent against the field plate 34 may be easily discharged into the auxiliary active region A2. When the auxiliary active region A2 is continuous to the primary active region A1, the induced charges may be further easily discharged into the whole active region. After the formation of the field plate 34, the narrowed portion 37b, and the pad 37a may be covered with still another insulating film made of, for instance, silicon nitride (SiN), which may enhance the reliability against the invasion of moisture, or water, into the primary active region A1.

Finally, forming openings in the insulating film 20 in respective portions above the electrodes of the drain 31 and the source 32, and forming interconnections primarily made of gold (Au) each connected with the electrodes of the drain 31 and the source 32 so as to connect the source electrode 32 with the field plate 34, the process of forming the transistor 1A of the present embodiment may be completed.

Advantages of the transistor 1A and the process of forming the transistor 1A will be described. The process forms the field plate 34 by the steps including the lift-off technique using the spray jet of the solvents. That is, residual metals 35 accumulated on the masks, M1 and M2, are removed by solving the masks, M1 and M2 with the solvent. In a conventional arrangement of a transistor with a field plate, the field plate becomes electrically isolated on the insulating film 20 just after the formation thereof. Accordingly, charges induced by friction may be easily accumulated in the field plate 34. For instance, the jet spray of the solvent for resolving photoresists for the masks, M1 and M2, the sprayed solvent causes the friction against the field plate 34 and charges the field plate 34. Excessively accumulated charges in the field plate 34 sometimes cause arced discharge between the field plate 34 and the gate electrode 33, which makes a short circuit not only between the field plate 34 and the gate electrode 33 but between the source electrode 32 and the gate electrode 33. Thus, the transistor 1A no longer behaves as a signal amplifying device.

A thicker insulating film 22 may suppress the arced discharge due to the excessively accumulated charges in the field plate 34. However, a thicker insulating film 22 may reduce the function of the field plate 34, namely, the reduction of the field strength at the edge of the gate electrode 33. Accordingly, the insulating film 22 inevitably has a thickest limit.

The process according to the present embodiment makes the field plate 34 in contact with the semiconductor stack 18 during the formation thereof, which means that the charges may be easily discharged into the semiconductor stack 18 even the process of forming the field plate causes excess charges therein. Not only the field plate 34 itself but the auxiliary active region A2 in the semiconductor stack 18 may accumulate the charges, which may drastically lower a threshold to cause the arced discharge between the field plate 34 and the gate electrode 33.

Figure 9:
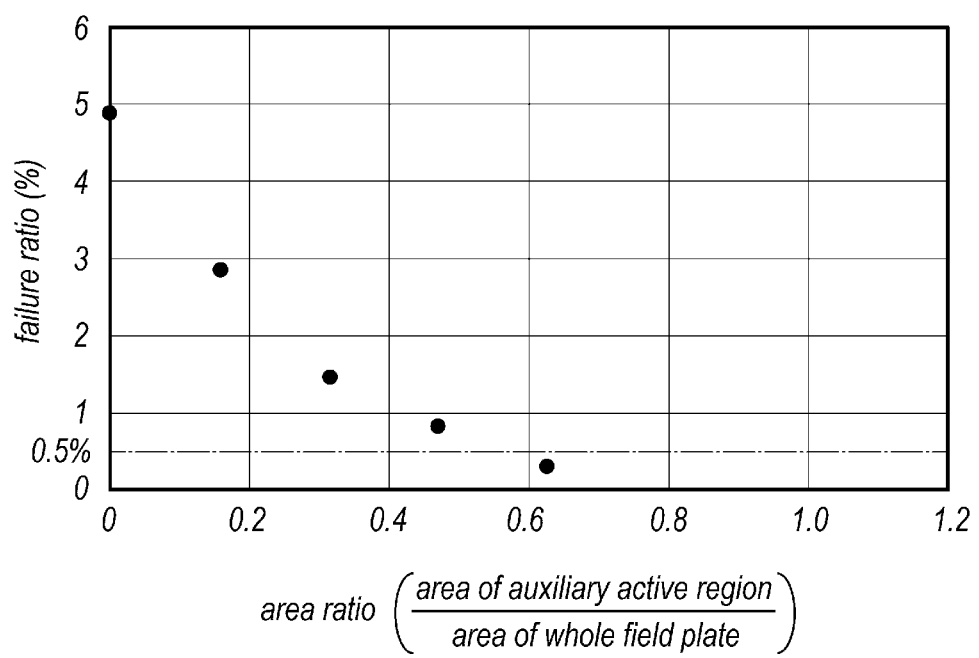
FIG. 9 shows a failure ratio of the transistor against an area of the auxiliary active region against a total area of the field plate.

FIG. 9 shows a behavior of failure ratio against area ratio ($S_{A2}/S_{FP}$), exactly, an area of the auxiliary active region $A_2$ against an area of the whole field plate 34 including the narrowed portion 37b and the pad 37a. Referring to FIG. 9, the failure ratio lowers as an increase of the area ratio ($S_{A2}/S_{FP}$), in particular, when the area ratio ($S_{A2}/S_{FP}$) exceeds 0.6, the failure ratio becomes smaller than 0.5%, which is the designed limit for the transistor 1A, and about 1/10 of an arrangement where the field plate 34 is not in contact with the auxiliary active region A2, namely, when the area ratio is zero. A greater area ratio ($S_{A2}/S_{FP}$) means that the auxiliary active region A2 has an area enough wider than the total area of the field plate, 34, 37a, and 37b, which may accumulate greater charges to be induced within the field plate 34.

The field plate 34 may be formed by the lift-off process using the spray jet of the solvents to remove the masks, M1 and M2. The spray jet may induce the charges by the friction of the solvents against the field plate 34, but the induced charges may be easily discharged into the auxiliary active region A2. Accordingly, an excessive accumulation of the charges within the field plate 34 may be prevented. The solvents may be sprayed under the pressure of 5 to 50 MPa. The pressure higher than 5 MPa may thoroughly remove the masks, M1 and M2; while, that lower than 50 MPa may effectively prevent the field plate 34 and the interconnection 37 from being peeled off.

The second insulating film 22 in a portion covering the gate electrode 33 may have a thickness of 100 to 500 nm to effectively show the function of the field plate 34, that is, to moderate the field strength at the edge of the gate electrode 33. Because the transistor 1A of the present embodiment makes the field plate 34 in contact with the auxiliary active region A2, the insulating film 22 may be thinner than 500 nm. Also, the field plate 34 may be formed on the thinned insulating film 22; accordingly, the coupling between the drain electrode 31 and the gate electrode 33 may be effectively suppressed. The insulating film 22 thicker than 100 nm may reduce the gate leak current through the insulating film 22.

The auxiliary active region A2 may be isolated from the primary active region A1, that is, the inactive region B1 may exist between the two active regions, A1 and A2, which may reduce the drain leak current flowing from the drain electrode 31 to the source electrode 32 through the auxiliary active region A2 and the inactive region B2 outside of the gate electrode 33.

In the foregoing detailed description, the transistor and the process of forming the transistor according to the present invention have been described with reference to specific exemplary embodiments thereof. It will, however, be evident that various modifications and changes may be made thereto without departing from the broader spirit and scope of the present invention. For instance, the embodiment concentrates on a transistor type of high electron mobility transistor (HEMT), but the present invention may be applicable to other type of a transistor implementing a field plate. Also, the auxiliary active region A2 is provided at a position side by side with the source electrode 32 along the longitudinal direction thereof. However, the auxiliary active region A2 is not restricted to this position. The auxiliary active region A2 is formed anywhere as far as outside of the primary active region A1. Also, the embodiment provides the auxiliary active region A2 for several field plates 34, that is, two field plates 34 are in contact with one auxiliary active region A2. However, the field plates 34 may have respective auxiliary active regions A2. Accordingly, the present specification and figures are to be regarded as illustrative rather than restrictive.

What is claimed is:

1. A semiconductor device type of field effect transistor (FET) primarily made of nitride semiconductor materials, comprising:
   a nitride semiconductor stack having a primary active region, an auxiliary active region, and an inactive region surrounding the primary active region and the auxiliary active region, the primary active region being electrically isolated from the auxiliary active region;
   electrodes of a source, a drain, and a gate each provided on the nitride semiconductor stack in the primary active region;
   an insulating film that covers the electrodes and the nitride semiconductor stack exposed between the electrodes, the insulating film providing an opening in the auxiliary active region; and
   a field plate provided on the insulating film and overlapping with the gate electrode,
   wherein the field plate is electrically in contact with the auxiliary active region through the opening provided in the insulating film.

2. The semiconductor device according to claim 1, wherein the insulating film has a thickness of 100 to 500 nm in a portion covering the gate electrode.

3. The semiconductor device according to claim 1, wherein the field plate has a ratio of an area in contact with the auxiliary active region against a total area thereof, the ratio being greater than 0.6.

4. The semiconductor device according to claim 1, wherein the primary active region is electrically isolated from the auxiliary active region by the inactive region.

5. The semiconductor device according to claim 4, wherein the electrodes of the source, the drain, and the gate extend along a respective longitudinal direction, the auxiliary active region being outside of the source electrode along the respective longitudinal direction.

6. The semiconductor device according to claim 1, wherein the auxiliary active region has resistivity smaller than $10^{-2}$ Ωcm.

7. The semiconductor device according to claim 1, wherein a width of an area of the field plate in contact with the auxiliary active region is larger than a width of the field plate provided over the gate electrode.

8. The semiconductor device according to claim 1, wherein in a longitudinal direction, a length of the field plate overlapping the gate is longer than a length of the source electrode and the drain electrode.

9. The semiconductor device according to claim 1, wherein the field plate covers at least a portion of the gate electrode in a lateral direction of the field plate.

10. The semiconductor device according to claim 1, wherein, in a lateral direction, a width of the auxiliary active region is larger than a width of the source electrode.

11. The semiconductor device according to claim 7, wherein, in a lateral direction, the width of the area of the field plate is narrower than a width of the source electrode.

12. The semiconductor device according to claim 1, including a plurality of the field effect transistors, wherein each transistor has a field plate, and the field plates are connected.

13. The semiconductor device according to claim 12, wherein each field plate is connected at the auxiliary active region.

14. The semiconductor device according to claim 12, wherein the primary active region is provided across the plurality of field effect transistors.

* * * * *